(12) United States Patent
Ong et al.

(10) Patent No.: US 8,456,926 B2
(45) Date of Patent: Jun. 4, 2013

(54) MEMORY WRITE ERROR CORRECTION CIRCUIT

(75) Inventors: Adrian E. Ong, Pleasanton, CA (US); Vladimir Nitikin, Campbell, CA (US)

(73) Assignee: Grandis, Inc., Milpitas, CA (US)

(*) Notice: Subject to any disclaimer, the term of this patent is extended or adjusted under 35 U.S.C. 154(b) by 114 days.

(21) Appl. No.: 13/013,616

(22) Filed: Jan. 25, 2011

(65) Prior Publication Data
US 2012/0127804 A1    May 24, 2012

Related U.S. Application Data

(60) Provisional application No. 61/415,239, filed on Nov. 18, 2010.

(51) Int. Cl.
*G11C 7/00* (2006.01)
*G11C 8/00* (2006.01)
*G11C 11/00* (2006.01)

(52) U.S. Cl.
USPC .......... 365/189.05; 365/189.07; 365/189.016; 365/158; 365/230.06

(58) Field of Classification Search
USPC .......... 365/49.1, 49.17, 158, 185.09, 185.33, 365/189.05, 189.07, 200, 230.08, 230.06
See application file for complete search history.

(56) References Cited

U.S. PATENT DOCUMENTS

| | | | |
|---|---|---|---|
| 5,754,567 A * | 5/1998 | Norman | 365/185.09 |
| 6,421,293 B1 | 7/2002 | Candelier et al. | |
| 6,512,685 B1 * | 1/2003 | Lien et al. | 365/189.07 |
| 6,552,928 B1 | 4/2003 | Qi et al. | |
| 6,590,816 B2 * | 7/2003 | Perner | 365/200 |
| 6,590,825 B2 | 7/2003 | Tran et al. | |
| 6,700,827 B2 * | 3/2004 | Lien et al. | 365/49.17 |
| 6,842,361 B2 | 1/2005 | Miyatke et al. | |
| 7,394,685 B2 | 7/2008 | Ooishi et al. | |
| 7,742,329 B2 | 6/2010 | Yoon et al. | |
| 7,773,438 B2 * | 8/2010 | Fekih-Romdhane | 365/200 |
| 7,817,485 B2 * | 10/2010 | Hsu et al. | 365/189.07 |
| 7,830,742 B2 * | 11/2010 | Han | 365/230.08 |
| 7,936,592 B2 | 5/2011 | Wang et al. | |

(Continued)

FOREIGN PATENT DOCUMENTS

JP    58062891 A    4/1983

OTHER PUBLICATIONS

Notice of Allowance for U.S. Appl. No. 12/558,451 mailed on Aug. 11, 2011.

(Continued)

*Primary Examiner* — Trong Phan
(74) *Attorney, Agent, or Firm* — Renaissance IP Law Group LLP

(57) ABSTRACT

Memory circuit includes; an array, row decoder, column decoder, addressing circuit to receive an address of the data bit, control logic receiving commands and transmitting control signals to memory system blocks, and sensing and write driver circuits coupled to a selected column. A hidden read compare circuit couples between the sensing circuit and write driver, which couples an error flag to the control logic circuit responsive to a comparison between a data bit in the input latch and a data-out read from the memory array. A write error address tag memory is responsive to the error flag and is coupled to the addressing circuit via a bidirectional bus. A data input output circuit having first and second bidirectional buses to transmit and receive said data bit is provided. Write error address tag memory stores the address if the error flag is set and provides the address during a re-write operation.

12 Claims, 9 Drawing Sheets

U.S. PATENT DOCUMENTS

| | | | |
|---|---|---|---|
| 8,045,381 B2 * | 10/2011 | Wuidart | 365/185.09 |
| 8,064,244 B2 * | 11/2011 | Zhang et al. | 365/158 |
| 8,107,304 B2 * | 1/2012 | Merritt et al. | 365/189.05 |
| 2005/0268207 A1 | 12/2005 | Gallagher et al. | |
| 2008/0025095 A1 | 1/2008 | Ahn et al. | |
| 2008/0189588 A1 | 8/2008 | Tanaka et al. | |
| 2008/0215954 A1 | 9/2008 | Oshikiri | |

OTHER PUBLICATIONS

Notice of Allowance for U.S. Appl. No. 12/544,189, mailed on Aug. 24, 2011.

Extended European Search Report for EP11188861.6, mailed Nov. 30, 2012.

* cited by examiner

MEMORY WRITE ERROR CORRECTION CIRCUIT

CROSS-REFERENCES TO RELATED APPLICATIONS

The present application claims benefit under 35 USC 119(e) of U.S. provisional application No. 61/415,239, filed Nov. 18, 2010, entitled "Memory Write Error Correction System," the content of which is incorporated herein by reference in its entirety.

This application is related to commonly assigned application Ser. No. 61/363,576, filed Jul. 12, 2010, entitled "NON-VOLATILE STATIC RAM CELL CIRCUIT AND TIMING METHOD"; commonly assigned application Ser. No. 61/352,306, filed Jun. 7, 2010, entitled "MULTI-SUPPLY SYMMETRIC DRIVER CIRCUIT AND TIMING METHOD"; commonly assigned application Ser. No. 12/558,451, filed Sep. 11, 2009, entitled "DIFFERENTIAL READ AND WRITE ARCHITECTURE"; commonly assigned application Ser. No. 12/544,189, filed Aug. 19, 2009, entitled "DYNAMIC MULTISTATE MEMORY WRITE DRIVER"; and commonly assigned application Ser. No. 12/903,152, filed Oct. 12, 2010, entitled "PSEUDO PAGE MODE MEMORY ARCHITECTURE AND METHOD," the contents of all of which are incorporated herein by reference in their entirety.

STATEMENT AS TO RIGHTS TO INVENTIONS MADE UNDER FEDERALLY SPONSORED RESEARCH OR DEVELOPMENT

This invention was made with U.S. Government support under Grant/Contract No. HR0011-09-C-0023 awarded by the DARPA. The U.S. Government retains certain rights in this invention.

BACKGROUND OF THE INVENTION

The present invention relates to memory integrated circuits, and more particularly to a non-volatile static random access memory.

Semiconductor memory devices have been widely used in electronic systems to store data. There are generally two types of semiconductor memories, including non-volatile and volatile memories. A volatile memory device, such as a Static Random Access Memory (SRAM) or a Dynamic Random Access Memory (DRAM) device, loses its data when the power applied to it is turned off. In contrast, a non-volatile semiconductor memory device, such as a Flash, Erasable Programmable Read Only Memory (EPROM) or a magnetic random access memory (MRAM), retains its charge even after the power applied thereto is turned off. Therefore, where loss of data due to power failure or termination is unacceptable, a non-volatile memory is used to store the data.

FIG. 1A is a simplified cross-sectional view of a magnetic tunnel junction (MTJ) structure 10 used in forming a spin transfer torque (STT) MRAM cell. MTJ 10 is shown as including, in part, a reference layer 12, a tunneling layer 14, and a free layer 16. Reference layer 12 and free layer 16 are ferromagnetic layers. Tunneling layer 14 is a nonmagnetic layer. The direction of magnetization of reference layer 12 is fixed and does not change. The direction of magnetization of free layer 16, however, may be varied by passing a sufficiently large current through the MTJ structure. In FIG. 1A, reference layer 12 and free layer 16 are assumed to have the same magnetization direction, i.e., they are in a parallel state. In FIG. 1B, reference layer 12 and free layer 16 are assumed to have opposite magnetization directions, i.e., they are in an anti-parallel state. In FIG. 1C, reference layer 12 and free layer 16 are assumed to have the same magnetization direction perpendicular to a plane defined by the interface of free layer 16 and tunneling layer 14. In FIG. 1D, reference layer 12 and free layer 14 are assumed to have opposite magnetization directions perpendicular to a plane defined by the interface of free layer 16 and tunneling layer 14.

To switch from the parallel state, as shown in FIG. 1A, to the anti-parallel state, as shown in FIG. 1B, the voltage potential of reference layer 12 is increased relative to that of free layer 16. This voltage difference causes spin polarized electrons flowing from free layer 16 to reference layer 12 to transfer their angular momentum and change the magnetization direction of free layer 16 to the anti-parallel state, as shown in FIG. 1B. To switch from the anti-parallel state to the parallel state, the voltage potential of free layer 16 is increased relative to that of reference layer 12. This voltage difference causes spin polarized electrons flowing from reference layer 12 to free layer 16 to transfer their angular momentum and change the magnetization direction of free layer 16 to the parallel state, as shown in FIG. 1A.

To switch from the parallel state to the non-parallel state or vice versa, the voltage applied to MTJ 10 and the corresponding current flowing through MTJ must be greater than a respective pair of threshold values. The voltage that must exceed a threshold voltage in order for the switching to occur is also referred to as the switching voltage $V_c$. Likewise, the current that must exceed a threshold current in order for the switching to occur is referred to as the switching current $I_c$. As is well known, when free layer 16 and reference layer 12 have the same magnetization direction (parallel state), MTJ 10 has a relatively low resistance. Conversely, when free layer 16 and reference layer 12 have the opposite magnetization direction (anti-parallel state), MTJ 10 has a relatively high resistance. Due to the physical properties of an MTJ, the critical current required to change the state of an MTJ from a parallel to an anti-parallel is often greater than the critical current required to change the state of the MTJ from an anti-parallel to a parallel state.

FIG. 2A shows an MTJ 10 and an associated select transistor 20 together forming an STT-MRAM cell 30. Transistor 20 is often an NMOS transistor due to its inherently higher current drive, lower threshold voltage, and smaller area relative to a PMOS transistor. As is described further below, the current used to write a "1" in MRAM 30 is different than the current used to write a "0". The asymmetry in the direction of current flow during these two write conditions is caused by the asymmetry in the gate-to-source voltage of transistor 20. Accordingly, a write driver adapted to deliver sufficient current to write a "0", may not be able to provide enough current to write a "1". Similarly, a write driver adapted to deliver sufficient current to write a "1" may deliver a current that is greater than what would otherwise be an acceptable current level to write a "0".

In the following description, an MRAM cell is defined as being in a logic "0" state when the free and reference layers of its associated MTJ are in a parallel (P) state, i.e., the MTJ exhibits a low resistance. This low resistance state is also alternatively shown as $R_{low}$, or $R_P$ state Conversely, an MRAM cell is defined as being in a logic "1" state when the free and reference layers of its associated MTJ are in an anti-parallel (AP) state, i.e., the MTJ exhibits a high resistance. This high resistance state is also alternatively shown as $R_{high}$ or $R_{AP}$ state. Furthermore, in the following, it is assumed that the reference layer of the MTJ faces its associated select transistor, as shown in FIG. 2A. Therefore, in accordance with the discussion above, a current flowing along the direction of arrow 35 (the up direction) (i) either causes a switch from the P state to the AP state thus to write a "1", (ii) or stabilizes the previously established AP state of the associated MTJ. Likewise, a current flowing along the direction of arrow 40 (the down direction) (i) either causes a switch from the AP state to the P state thus to write a "0", (ii) or stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 (i) either causes a switch from the AP state to the P, (ii) or stabilizes the previously established P state of the associated MTJ. Likewise, in such embodiments, a current flowing along the direction of arrow 40 (i) either causes a switch from the P state to the AP state, (ii) or stabilizes the previously established AP state. FIG. 2B is a schematic representation of MRAM 30 of FIG. 2A in which MTJ 10 is shown as a storage element whose resistance varies depending on the data stored therein. The MTJ changes its state (i) from P to AP when the current flows along arrow 35, and (ii) from AP to P when the current flows along arrow 40.

As described above, the voltage required to switch an MTJ from an AP state to a P state, or vice versa, must exceed a critical value Vc. The current corresponding to this voltage is referred to as the critical current Ic. FIG. 3 represents the variation in the MTJ state (or its resistance) during various write cycles. To transition from the P state (low resistance state) to AP state (high resistance state), a positive voltage of Vc is applied. Once in the AP state, removing the applied voltage does not affect the state of the MTJ. Likewise, to transition from the AP state to the P state, a negative voltage of Vc is applied. Once in the P state, removing the applied voltage does not affect the state of the MTJ. The resistance of the MTJ is $R_{high}$ when it is in AP state and receives no or very small voltage. Likewise, the resistance of the MTJ is $R_{low}$ when it is in P state and receives no or very small voltage.

FIG. 4A shows an MTJ 10 being programmed to switch from an anti-parallel state (i.e., high resistance state, or logic "1" state) to a parallel state so as to store a "0" (i.e., low resistance state, or logic "0" state). It is assumed that MTJ 10 is initially in a logic "1" or AP state. As described above, to store a "0", a current $I_c$ greater than the critical current is caused to flow through transistor 20 in the direction of arrow 40. To achieve this, the source node (SL) of transistor 20 is coupled to the ground potential via a resistive path (not shown), a positive voltage Vpp is applied to the gate node (WL or wordline) of transistor 20, and a positive voltage $V_{cc}$ is applied to the drain node (BL or bitline) of transistor 20.

FIG. 5 is an exemplary timing diagram of the voltage levels at nodes WL, SL, SN and BL during write "0" operation, occurring approximately between times 25 ns and 35 ns, and write "1" operation, occurring approximately between times 45 ns and 55 ns, for a conventional MTJ such as MTJ 10 shown in FIGS. 4A and 4B. Supply voltage $V_{CC}$ is assumed to be 1.8 volts. Signal WL, as well as signal CS which is a column select signal, are shown as having been boosted to a higher Vpp programming voltage of 3.0 volts. During the write "0" operation, the voltages at nodes BL, SL and SN are shown as being approximately equal to 1.43 V, 0.341 V, and 0.888V respectively. During the write "1" operation, the voltages at nodes BL, SL and SN are shown as being approximately equal to 0.213 V, 1.43V, and 0.841 V respectively. Although not shown, for this exemplary computer simulation, the currents flowing through the MTJ during write "0" and "1" operations are respectively 121 µA and 99.2 µA.

FIG. 4B shows an MTJ being programmed to switch from a parallel state to an anti-parallel state so as to store a "1". It is assumed that MTJ 10 is initially in a logic "0" or P state. To store a "1", a current $I_c$ greater than the critical current is caused to flow through transistor 20 in the direction of arrow 35. To achieve this, node SL is supplied with the voltage $V_{cc}$ via a resistive path (not shown), node WL is supplied with the voltage Vpp, and node BL is coupled to the ground potential via a resistive path (not shown). Accordingly, during a write "1" operation, the gate-to-source voltage of transistor 20 is set to $(V_{WL}-V_{SN})$, and the drain-to-source voltage of transistor 20 is set to $(V_{SL}-V_{SN})$.

During redundancy operation, a memory chip may be tested and repaired at the factory (or by the seller) by determining the address locations of defective cells. The defective address locations are then mapped out of the final usable address space by replacing entire rows and/or columns in the regular memory array with redundant rows and/or columns provided on the same chip. The redundancy mapping is accomplished by setting content addressable memory (CAM) bits granular only at the row and/or column level within the addressing/decoding circuitry. The redundancy operation is normally done by special test operation modes that are not made available to the memory's end-user so the memory producer can maintain control of the product quality. Once in the field, memory address locations mapped out by redundancy stay mapped out for the life of the part. In contrast, during normal write operation by an end-use, memory address locations are granular by individual cell and reusable (except for the case of permanently altered memory such as ROM or PROM). Thus, redundancy operations are different than normal write operations done by the end-user.

BRIEF SUMMARY OF THE INVENTION

In accordance with one embodiment of the present invention, a memory circuit includes, in part, a compare block configured to compare a first data adapted to be stored in a memory cell to a second data previously stored in the memory cell. The compare block is further configured to store an address of the memory cell in which the second data is stored if the second data does not match the first data. The memory cell is written to during subsequent write cycles.

In one embodiment, the address is stored in a tag memory.

In some embodiments, the memory circuit further includes, in part, a memory array, a write block and a read block. The write block is coupled between the memory array and the compare block. The read block is coupled between the memory array and the compare block such that the read block is adapted to sense the second data.

In some embodiments, the memory circuit further includes a control logic configured to store an inverse of the second data to the memory cell when the memory cell is not being accessed for a normal write operation by a device external to the memory.

In one embodiment, the memory cell is a DRAM, SRAM, ROM, PROM, EEPROM, FLASH, FeRAM, PRAM, MRAM or STT-MRAM cell.

In one embodiment, the memory array includes, in part, at least one column coupled to a multitude of the memory cells. The column includes, in part, a first signal line and a second signal line. The memory cell includes, in part, a first current carrying terminal coupled to the first signal line, a second current carrying terminal coupled to the second signal line and a control terminal coupled to a word-line.

In some embodiments, the memory cell further includes, in part, a magnetic tunnel junction and a first transistor. The magnetic tunnel junction has a first terminal coupled to the first current carrying terminal of the memory cell. The first transistor has a first current carrying terminal coupled to the second current carrying terminal of the non-volatile memory cell, a gate terminal coupled to the control terminal of the non-volatile memory cell and a second current carrying terminal coupled to a second terminal of the magnetic tunnel junction.

In accordance with one embodiment of the present invention, a method of correcting write errors during a write operation in a memory circuit includes, in part, comparing a first data adapted to be stored in a memory cell to a second data previously stored in the memory cell during a write operation, storing an address of the memory cell in which the second data is stored if the second data does not match the first data and writing to the memory cell during subsequent write cycles to correct the write error.

In some embodiments, the method further includes, in part, latching the address of the memory cell, latching the first data, writing the first data into a memory array at the address of the memory cell and sensing the second data during the write operation.

In accordance with one embodiment of the present invention, a method of correcting write errors during a write operation in a memory circuit includes, in part, comparing a first data adapted to be stored in a memory cell to a second data previously stored in the memory cell during a write operation, inverting the second data if the second data does not match the first data and writing the inverted second data to an address of the memory cell in which the second data is stored if the second data does not match the first data to correct the write error.

In some embodiments, the method further includes, in part, latching the address of the memory cell, latching the first data, writing the first data into a memory array at the address of the memory cell and sensing the second data during the write operation.

In accordance with one embodiment of the present invention, a method of correcting write errors after a write operation in a memory circuit includes, in part, loading an address of a memory cell in which a second data is stored if the second data does not match a first data after a write operation, sensing the second data, inverting the second data and writing the inverted second data to an address of the memory cell in which the second data is stored to correct the write error.

DETAILED DESCRIPTION OF THE INVENTION

During write operation, a memory cell may exhibit randomly different write times at different occasions even under the same, stable conditions. Such behavior may not result from wear-out mechanisms that could be screened out during factory testing, but instead, results from probabilistic behavior of the memory cell's write characteristics. Memory cells determined to be defective for non-probabilistic reasons can be removed from a cell population by testing at the factory (by the seller) to scrap bad chips or repair defects by replacing defective cells with redundant cells on-chip during a redundancy operation. However, the remaining population may still exhibit probabilistic behavior. Alternatively, after factory shipment to the field and when the chip is in regular use by the end-user, memory systems may be able to flag address locations corresponding to slow to write cells, mapping them out of the usable address space. The end-user mapping of slow to write cells results in a dwindling number of usable address locations over time since the mapped out cells are not expected to recover to normal. Thus, probabilistic cell behavior would result in either, low factory yield due to depleting limited redundant elements, or depleting the usable address space over time in the field.

In particular, during write operation, a memory cell may exhibit randomly different write times at different occasions under stable environmental conditions. This behavior may produce an error during writing data into a memory system at random occasions even for the cell population determined to be otherwise defect free. A new memory circuit solution is required to overcome this probabilistic cell behavior problem.

Figure 1A:
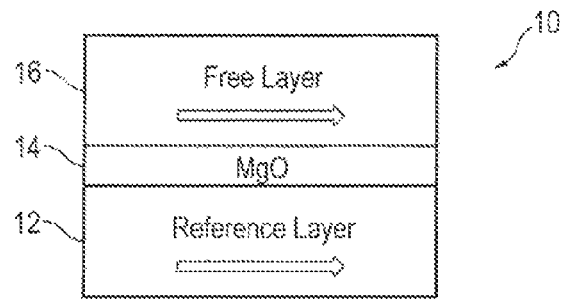
FIG. 1A is a simplified cross-sectional view of a magnetic tunnel junction structure of a magnetic random access memory cell when placed in a parallel magnetization state, as known in the prior art.
Figure 1B:
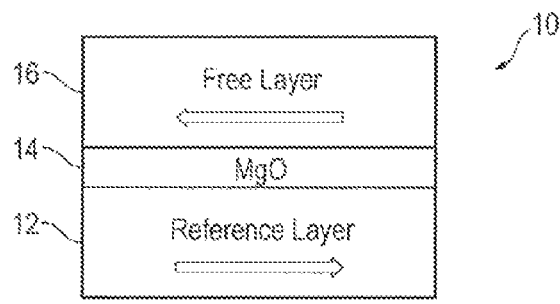
FIG. 1B shows the magnetic tunnel junction structure of FIG. 1A when placed in an anti-parallel magnetization state, as known in the prior art.
Figure 1C:
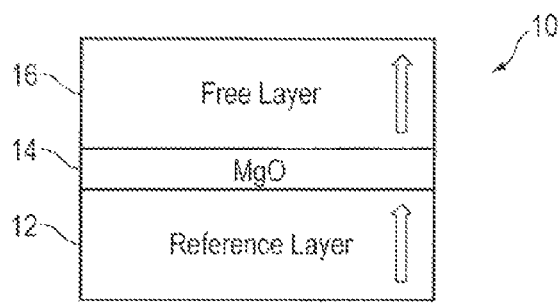
FIG. 1C is a simplified cross-sectional view of a magnetic tunnel junction structure of a magnetic random access memory (MRAM) cell when placed in a parallel magnetization state, as known in the prior art.
Figure 1D:
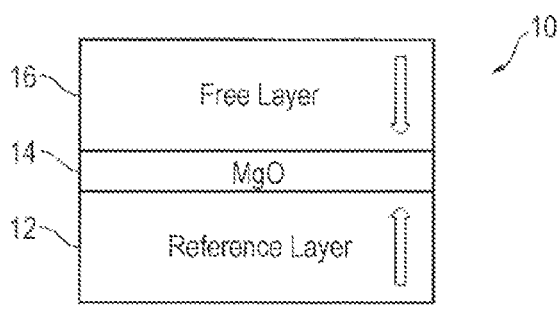
FIG. 1D shows the magnetic tunnel junction structure of FIG. 1D when placed in an anti-parallel magnetization state, as known in the prior art.
Figure 2A:
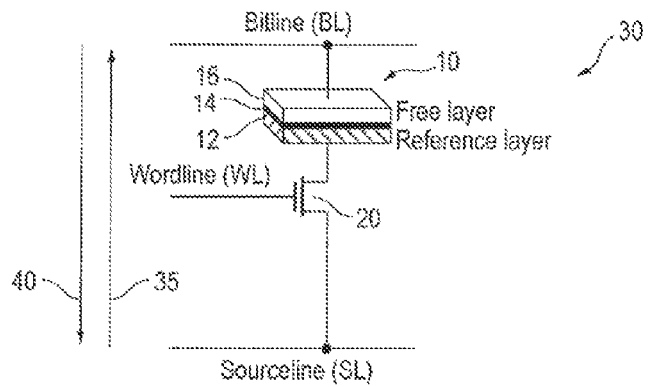
FIG. 2A shows a number of layers of a magnetic tunnel junction structure coupled to an associated select transistor, as known in the prior art.
Figure 2B:
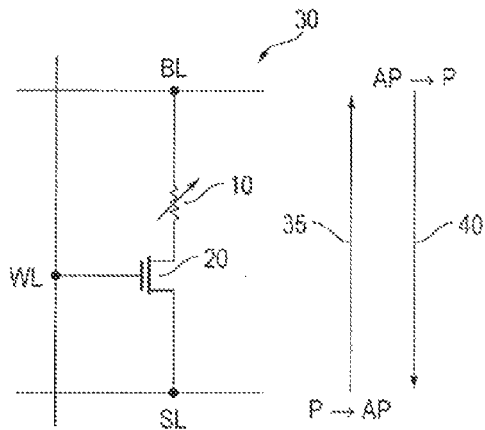
FIG. 2B is a schematic representation of the magnetic tunnel junction structure and its associated select transistor of FIG. 2A, as known in the prior art.
Figure 3:
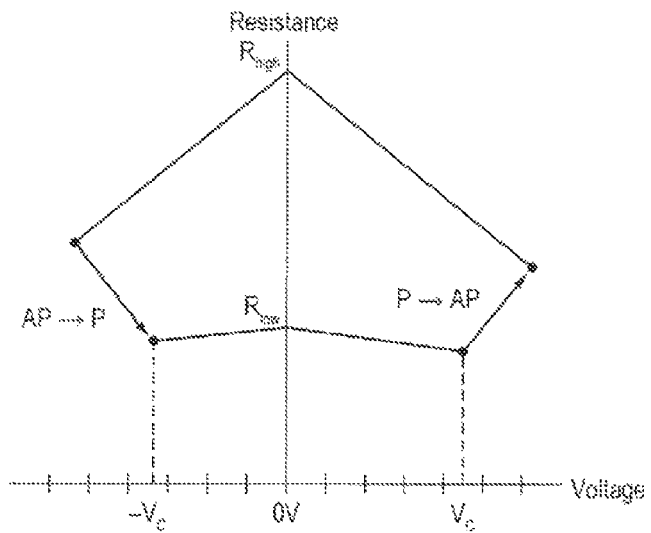
FIG. 3 shows the variation in the resistance of the magnetic tunnel junction structure of FIG. 2A in response to applied voltages, as known in the prior art.
Figure 4A:
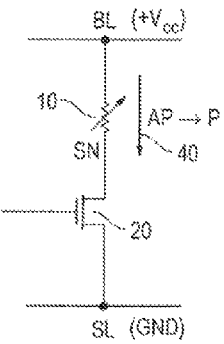
FIG. 4A shows a magnetic tunnel junction structure being programmed to switch from an anti-parallel state to a parallel state, as known in the prior art.
Figure 4B:
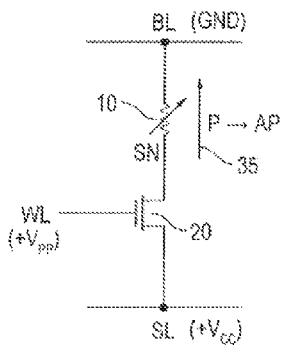
FIG. 4B shows a magnetic tunnel junction structure being programmed to switch from a parallel state to an anti-parallel state, as known in the prior art.
Figure 5:
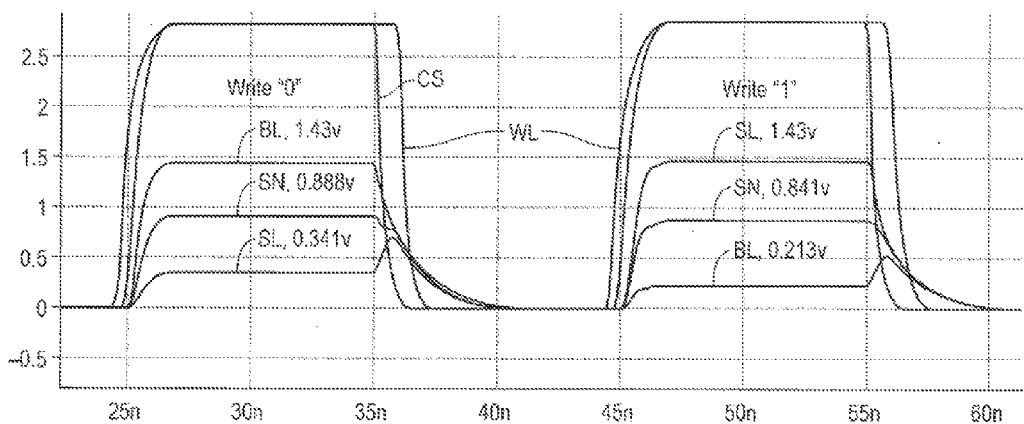
FIG. 5 is an exemplary timing diagram of a number of signals associated with a magnetic random access memory during write "0" and write "1" operations, as known in the prior art.
Figure 6:
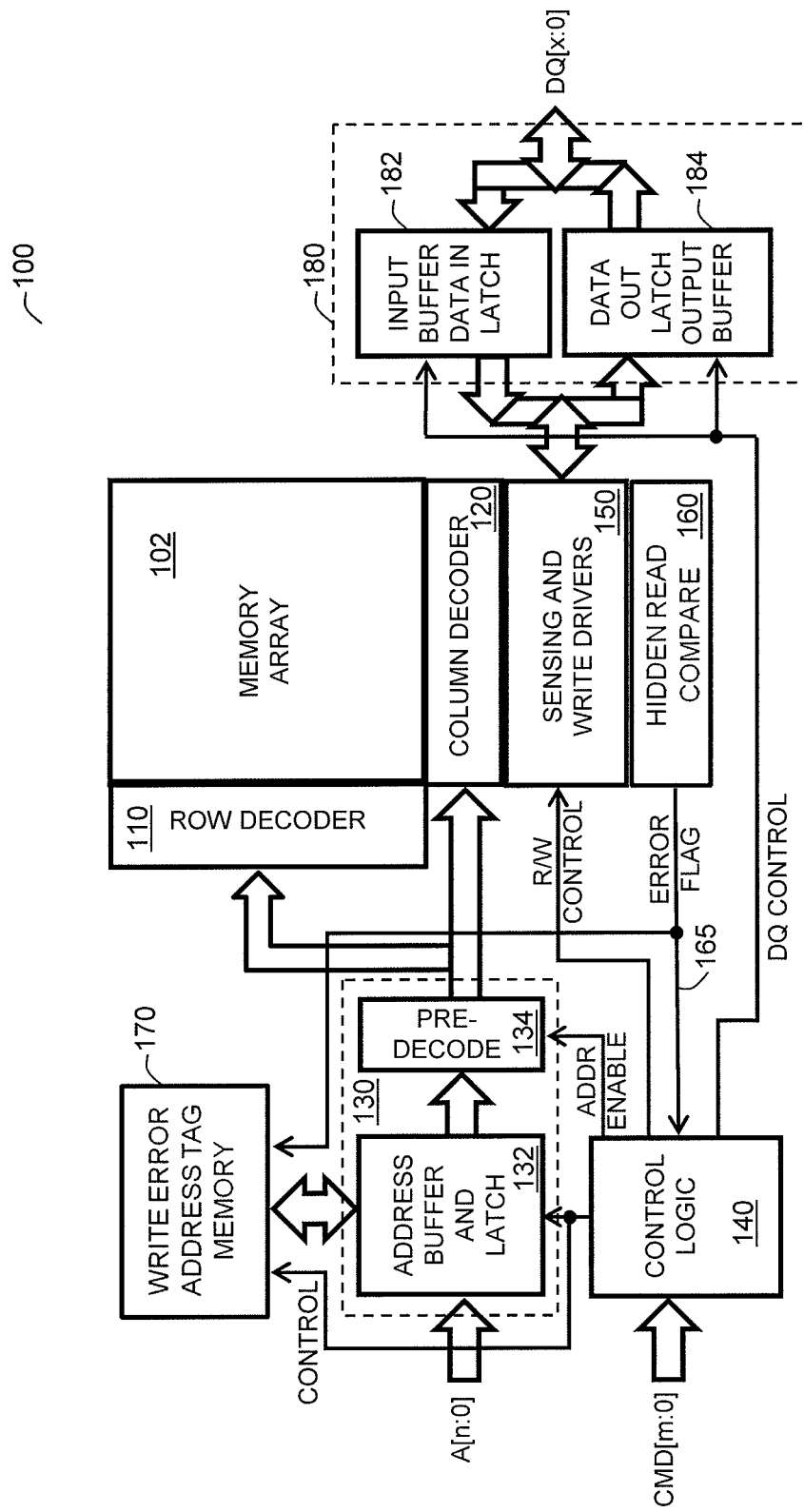
FIG. 6 is an exemplary block diagram of a memory system and associated circuitry, in accordance with one embodiment of the present invention.

In accordance with embodiments of the present invention, a tag memory stores address locations of data which fail to write properly due to probabilistic behavior. The stored tag address locations can be used to rewrite and correct the data after the user initiated regular write operation. Alternatively, the present invention may perform a write, hidden from the user, during the user initiated regular write operation when the cell fails to write in the allocated time due to probabilistic behavior. FIG. 6 is an exemplary block diagram of a memory system and associated circuitry 100, in accordance with one embodiment of the present invention. Memory system 100 includes a memory array 102, a row decoder 110, a column decoder 120, an addressing circuit 130, a control logic 140, a sensing and write drivers 150, a hidden read compare 160, a write error address tag memory 170 (alternatively referred to herein as tag memory) and a data input output 180. Addressing circuit 130 further includes an address buffer and latch 132 and a pre-decode 134. Data input output 180 further includes an input buffer data in latch 182 and a data out latch output buffer 184. It should be noted the terms sensing and reading may be used interchangeably herein, as are the terms sense and read.

In reference to FIG. 6, memory array 102 includes many columns, wordlines and memory cells located at the intersections of the columns and wordlines. Each memory cell is capable of storing a data bit. The memory cell may be a DRAM, SRAM, ROM, PROM, EEPROM, FLASH, FeRAM, PRAM, MRAM or STT-MRAM cell depending on the technology. As example, some of the embodiments described below will use STT-MRAM cells previously described. Row decoder 110 selects and drives one of the wordlines determined by its input bus driven by pre-decode 134. Column decoder 120 selects and drives one of the columns determined by its input bus also driven by pre-decode 134. Pre-decode 134 drives the row and column decoder input bus signals responsive to the address bus signals from the address buffer and latch 132 and the address (ADDR) enable signal from the control logic. Address buffer and latch 132 is responsive to the signals from the address bus A[n:0] and capable of latching the n+1 address signals received from outside the memory system corresponding to the location of a data bit. The address buffer and latch is also responsive to the control logic.

Control logic 140, as referenced in FIG. 6, receives signals from outside the memory system on a command bus CMD [m:0] and is also responsive to an error flag 165 from hidden read compare 160. The control logic sends signals; R/W control to sensing and write drivers 150, DQ control to data input output 180, and control to write error address tag memory 170.

In reference to FIG. 6, write error address tag memory 170 sends and receives address signals from address buffer and latch 132 via a bidirectional bus responsive to control logic 140 and to error flag 165 as will be described in greater detail below. Write error address tag memory 170 is capable of storing addresses of memory cells that exhibit probabilistic behavior and do not write successfully under a write cycle of the memory system. The addresses stored in write error address tag memory 170 represent stored data bits in memory that need to be logically inverted to properly represent the data originally input to the memory system. The write error address tag memory may be a non-volatile memory, FIFO, SRAM or D flip-flop registers. The memory cells in the write error address tag memory 170 may be based on the same technology type and/or design as the memory cells in memory array 102 or may be of different technology type and/or design. The width of the memory in write error address tag memory 170 may correspond to the number of address signals (i.e. n+1). The depth of the memory in write error address tag memory 170 may depend on the number of error correctable bits desired or required for each re-write operation. For example, if the probabilistic write error rate is high for the average memory cell population, the write error address tag memory depth may be chosen to be larger than if the error rate is small.

Input buffer data in latch 182 receives and latches data on a bidirectional bus DQ[x:0] from outside the memory system and transmits that data via a bidirectional bus to hidden read compare 160 which is integrated between the sensing and write driver as will be explained in more detail below. Data out latch output buffer 184 receives and latches data on a bidirectional bus from sensing and write drivers 150 and transmits data via bidirectional bus DQ[x:0] to outside the memory system. Hidden read compare 160 is integrated between the sensing circuit and write driver as will be explained in more detail below.

Figure 7:
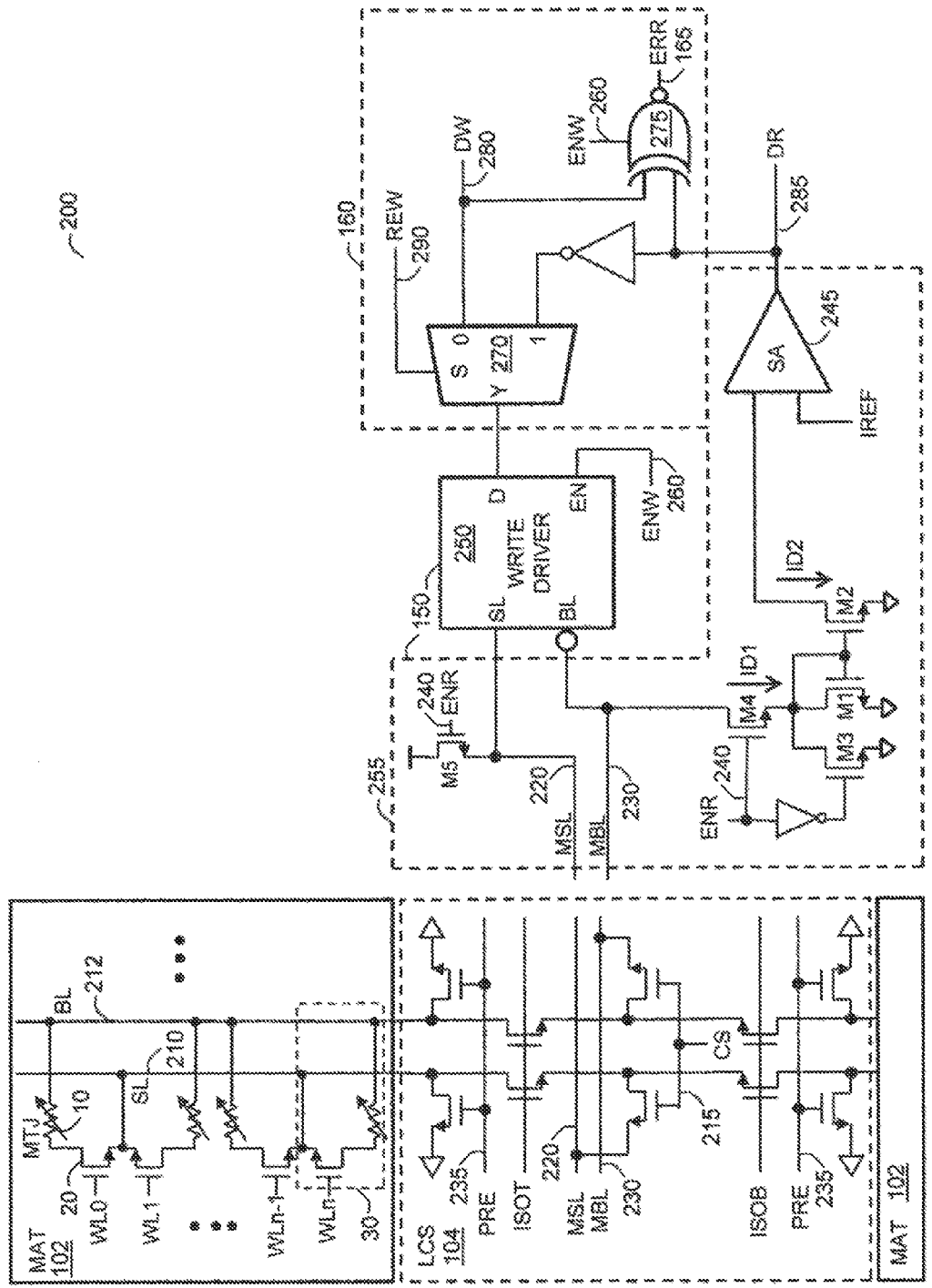
FIG. 7 is a schematic representation of portions of a memory system and associated writing and reading circuitry, in accordance with one embodiment of the present invention.

FIG. 7 is a schematic representation 200 of portions of a memory system 100 and associated writing and reading circuitry, in accordance with one embodiment of the present invention. Schematic diagram 200 is shown as including a memory array tile, or MAT 102, a local column select circuits (LCS) 104, sensing and write drivers 150, and hidden read compare 160. The embodiment shown in schematic diagram 200 includes STT-MRAM cells but is not limited by that embodiment and may include other memory types as discussed above.

MAT 102 includes a number of STT-MRAM cells 30 whose select transistors are coupled to wordlines WL0-WLn driven by the row decoder 110 described above in connection with FIG. 6. The STT-MRAM cells are also coupled to a source line (SL) 210 and a bit line (BL) 212 pair corresponding to one of the columns in memory array 102. The MAT includes a multitude of SL and BL pairs selectable by LCS 104 which is also in memory array 102. The LCS includes a selection circuit including pairs of n-channel select transistors which couple a selected SL and BL pair in MAT 102 to a pair of MSL 220 and MBL 230 lines under control of a column select (CS) 215, a precharge (PRE) 235, an isolation top (ISOT), and an isolation bottom (ISOB) signal. The LCS determines whether to couple adjacent MAT 102 above or below the LCS by enabling one of the respective ISOT or ISOB signals. In the example shown in FIG. 7, the top MAT is selected by enabling ISOT and disabling ISOB. One of the multitude of SL and BL pairs is selected by the CS signal driven by the column decoder, to couple the selected SL and BL pair to the respective MSL and MBL lines. The SL/BL and respective MSL/MBL lines are ready for write or read operation modes when PRE is disabled. MSL 220 and MBL 230 are coupled from LCS 104 to sensing circuit 255 (alternatively referred to herein as read block) and write driver 250 (alternatively referred to herein as write block). In an alternate embodiment (not shown) the SL and MSL signals may be omitted from the column and associated circuitry to provide a single line column for memory cells that do not require a complementary column pair to function and whose sources are coupled to ground within the MAT such as some ROM, PROM, EPROM, EEPROM, and Flash, as is commonly known in the art.

As shown in FIG. 7, write driver 250 is coupled to an enable write signal (ENW) 260 driven by the control logic and an output (Y) from hidden read compare 160 coupled to the data (D) input of the write driver. During a write mode operation, write driver 250 drives the MSL and MBL lines (and the respective SL and BL line pair) in complementary fashion as will be described in detail later under control of ENW. When ENW is disabled, write driver 250 does not drive the MSL and MBL lines.

In FIG. 7, sensing circuit 255 is enabled by an enable read (ENR) 240 signal and includes a transistor M5 coupled to the power supply and a transistor M3 coupled to the ground. M5 an M3 are coupled to the ENR signal and its complement, respectively. The ENR and ENW signals are not enabled simultaneously. When ENR is enabled high (write driver 250 is disabled), as shown in FIG. 7, transistor M3 is off while a transistor M4, controlled by ENR, passes the MBL signal to a current mirror M1 and M2, while transistor M5 couples MSL 220 to the power supply. Current ID1 flows in MBL through transistor M4 to transistor M1 of the current mirror. FIG. 7 also shows a sense amplifier (SA) 245, which is coupled to signal IREF and a current ID2 which flows through M2 of the current mirror. The SA compares ID2 with IREF and issues a data-out signal on a data read line 285 which is coupled to via the bidirectional bus to data out latch output buffer 184 and to hidden read compare 160. When ENR is disabled low, M4 isolates MBL 230 from the current mirror and M3 couples the current mirror input to a ground voltage. SA 245 may also be placed locally within MAT 102 or placed with the global sense amps and global write drivers.

The hidden read compare 160 (alternatively referred to herein as compare block), as shown in FIG. 7, includes an exclusive disjunction or XOR 275, an inverter and a multiplexer 270. The hidden read compare is controlled by ENW 260 and a re-write (REW) signal 290, both sent from control logic 140. The inputs of XOR 275 are DR 285 from sensing circuit 255 and data write DW 280 from input buffer data in latch 182 responsive to ENW. The multiplexer 270 selects which of its two inputs 0 or 1, an inverted DR 285 signal or the DW signal to pass through from its output Y to the input D of the write driver responsive to REW at input S. Hidden read compare 160 may also be placed locally within MAT 102 or placed with the global sense amps and global write drivers.

Figure 8:
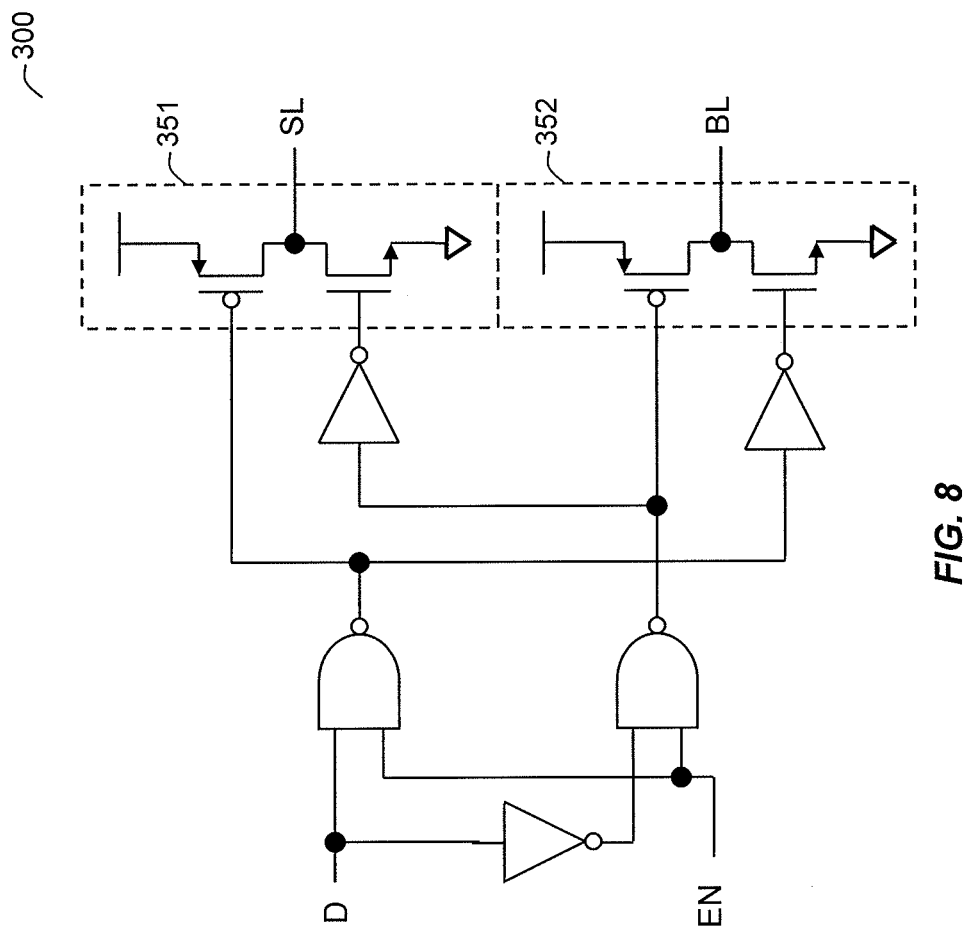
FIG. 8 is a schematic representation of portions of a memory system and associated writing circuitry, in accordance with one embodiment of the present invention.

FIG. 8 is a schematic representation 300 of portions of a memory system and associated writing circuitry, in accordance with one embodiment of the present invention corresponding to write driver 250 referenced previously in FIG. 7. As shown in FIG. 8, write driver 250 includes two inverter drivers 351 and 352 driving SL and BL signals respectively under control of ENW 260. SL is coupled to MSL while an inverted BL is coupled to MBL. When EN (ENW) is enabled high, an inverted version of input D from the hidden read compare 160 is coupled to the BL signal while a non-inverted version of input D is coupled to the SL signal, the BL and SL signals being logical complements. When EN (ENW) is disabled low, the transistors in both inverter drivers 351 and 352 are off independent of the state of input D and control of the MSL and MBL lines reverts to the sensing circuits.

Each write cycle is followed by a hidden read cycle of the same memory location. The data from the hidden read operation (data-out) is compared to the data bit value just being written. If the data matches, then the write cycle is finished. If the data doesn't match, then an ERROR flag is generated; the output of the XOR will go active high. The memory address for this location is "tagged" or stored in the write error address tag memory for later re-write operation.

In accordance with one embodiment of the present invention, the memory array described above also includes circuitry for carrying out the following operations:

latching said address of said data bit into said addressing circuit;
latching said data bit into said data input output circuit;
writing said data bit into said memory array at said address of said data bit;
reading a data-out bit from said memory array at said address of said data bit;
comparing said data bit with said data-out bit to determine if said data bit equals said data-out bit;
writing said address of said data bit in said write error address tag memory if said comparing step determines said data bit does not equal said data-out bit and not writing said address of said data bit in said write error address tag memory if said comparing step determines said data bit equals said data-out bit.

Figure 9A:
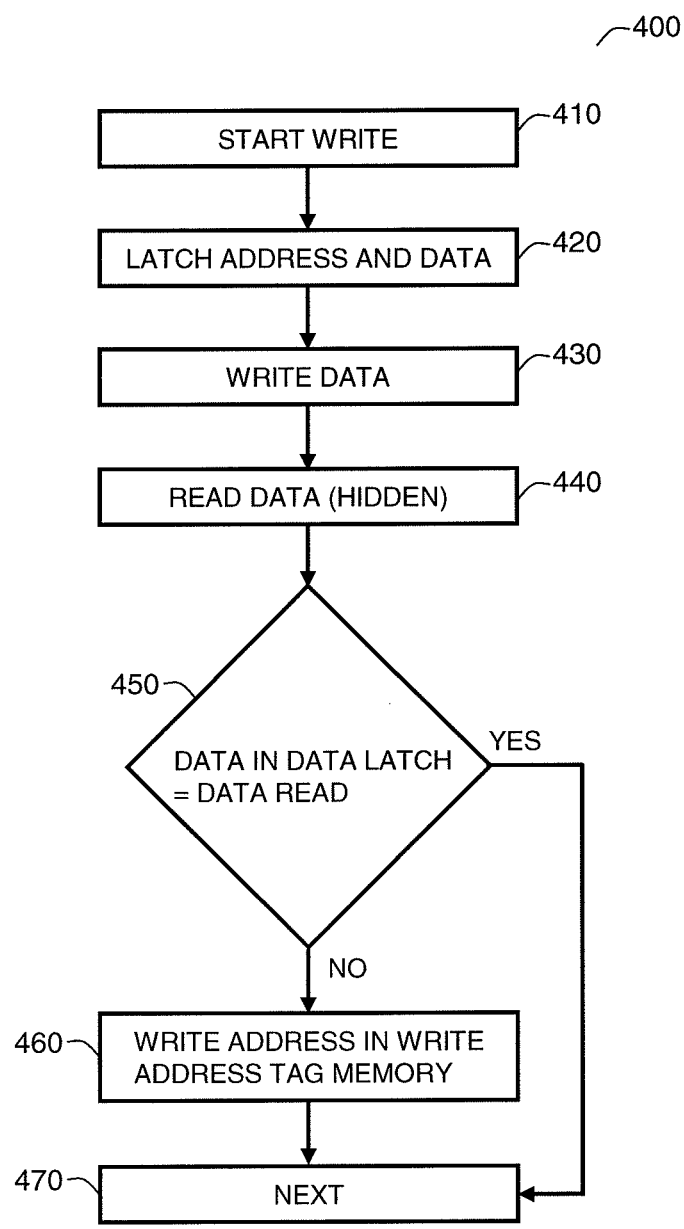
FIG. 9A is an exemplary flow chart diagram illustrating portions of a writing method of a memory system, in accordance with one embodiment of the present invention.

FIG. 9A is an exemplary flow chart diagram 400 illustrating portions of a writing method of a memory system, in accordance with one embodiment of the present invention. After the start of a write operation 410, during a latch address and data 420 step, the data (alternatively referred to herein as first data) is latched in input buffer data in latch 184 and passed through multiplexer 270 in hidden read compare 160 to the D input of write driver 250. Also during latch address and data 420, the address of the data bit is latched in address buffer and latch 132 and passed through to pre-decode 134 which drives the input buses for the row and column decoders which in turn select a wordline and column in the memory array. The next step is a write data 430 into the memory cell at the selected address in the memory array by enabling ENW.

As FIG. 9A continues to show, following the write data step, a hidden read data step 440 is executed on the same address location passing a data-out bit to the hidden read compare 160. The read is hidden since it is performed automatically as part of the write operation without having to instruct the memory system via the CMD bus. Next, during a data in data latch=data read 450 step, the data bit from input buffer data in latch 182 (i.e. the "true" or first data bit) is compared against the data-out bit from the SA 245 (i.e. the data bit which may or may not have written successfully) (alternatively referred to herein as second data) to determine if the data bit equals the data-out bit. The logical comparison is done by exclusive disjunction or XOR 275 in the hidden read compare 160. If the data bit equals the data-out bit the write operation was successful and the next operation 470 can proceed. However, if the data bit does not equal the data-out bit, the exclusive disjunction or XOR sets error flag (ERR) 165 which signals controller 140 to pass the "tagged" address from address buffer and latch over the bidirectional bus to write error address tag memory 170 where the address is written (operation 460) and stored until a re-write operation can be performed as described below. Operation 460 is a transparent operation and can be easily done at the beginning of the next memory cycle. It does not delay the next memory operation 470.

In another embodiment, the total write cycle may be extended to include an additional hidden write operation. In this case, the write correction operation (re-write) may be transparent to the user. The write timing specification can be made to include this transparent re-write time. Therefore, write cycle time may be the same whether or not re-write is required.

Figure 9B:
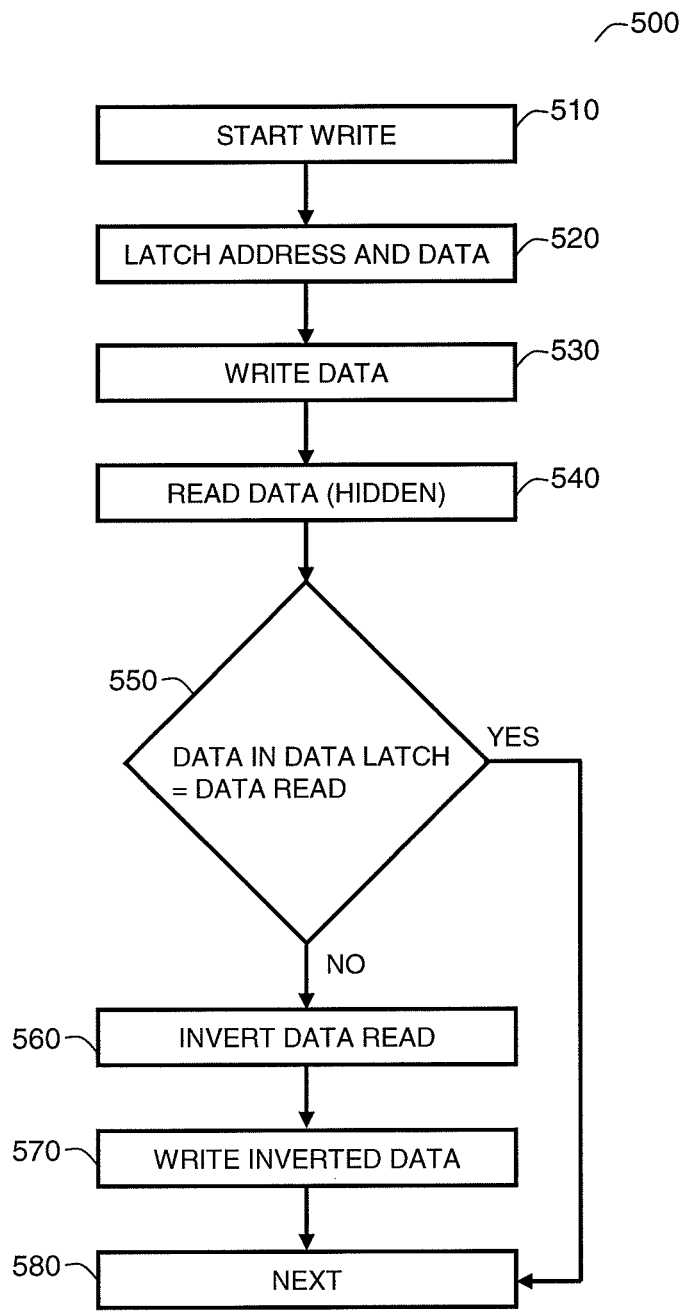
FIG. 9B is an exemplary flow chart diagram illustrating portions of a writing method of a memory system, in accordance with another embodiment of the present invention.

FIG. 9B is an exemplary flow chart diagram 500 illustrating portions of a writing method of a memory system, in accordance with another embodiment of the present invention. FIG. 9B shows the steps 510 through 550 are the same as steps 410 through 450 shown in FIG. 9A and will not be described again. In step 560, the data-out at the current address location in the memory array is passed to SA output DR 285. Next, an invert data read 560 step is done by the inverter in hidden read compare 160 which inverts the data-out bit and directs the inverted data-out bit to the D input of write driver 250 via the multiplexer 270 responsive to the REW signal from the control logic. A write inverted data 570 step is done next to write the now corrected inverted data-out bit into the current address in the memory array. Then the next 580 operation can be performed.

Depending on the memory system specification, the tagged address can be used to re-write the memory cell located at the tagged address, at a convenient time when the processor or system periphery is not accessing the memory. During the re-write cycle, the data in the tagged address is simply inverted. To invert the data, the memory bit must be read first using the hidden read feature and the opposite data is written into the cell. Thus, the original writing error caused by the cell's previous probabilistic lengthy write behavior is corrected. Alternatively, the data can be corrected immediately in a handshaking system where the memory sends a "halt access" signal to the processor or master system while the re-write cycle is in progress. A "re-write complete" signal can be sent to the master system once the re-write operation is completed.

In accordance with one embodiment of the present invention, the memory array described above also includes circuitry for carrying out the following operations:

loading said address of said data bit from said write error address tag memory into said addressing circuit;

reading a data-out bit in said memory array at said address of said data bit;

inverting said data-out bit in said hidden read compare circuit; and, writing said inverted data-out bit into said memory array at said address of said data bit.

Figure 10:
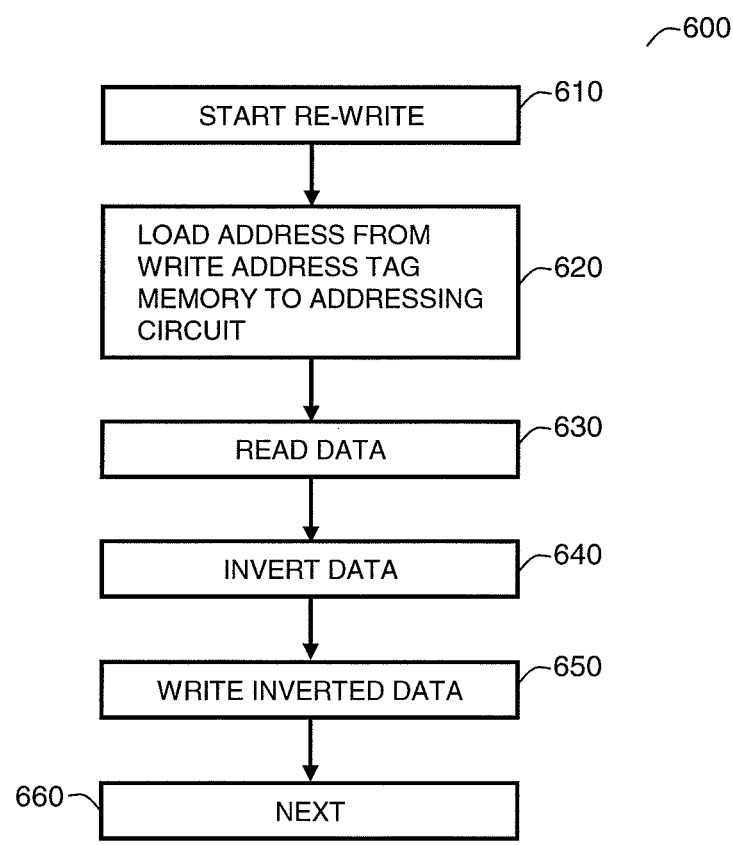
FIG. 10 is an exemplary flow chart diagram illustrating portions of a re-writing method of a memory system, in accordance with one embodiment of the present invention.

FIG. 10 is an exemplary flow chart diagram 600 illustrating portions of a re-writing method of a memory system, in accordance with one embodiment of the present invention. After the start of a re-write operation 610, during a load error address from write address tag memory to addressing circuit 620 step, the "tagged" address from write error address tag memory 170 is loaded over the bidirectional bus into address buffer and latch 132. Then, the data at the previously "tagged" address is read out during a read data 630 step. The data-out at the "tagged" address location in the memory array is passed to SA output DR 285. Next, an invert data 640 step is done by the inverter in hidden read compare 160 which inverts the data-out bit and directs the inverted data-out bit to the D input of write driver 250 via the multiplexer 270 responsive to the REW signal from the control logic. A write inverted data 650 step is done next to write the now corrected inverted data-out bit into the previously "tagged" address in the memory array. Then the next 660 operation can be performed. The memory space taken up by the previously "tagged" address stored in the write error address tag memory can now be made available to new "tagged" addresses on subsequent write cycles.

The above embodiments of the present invention are illustrative and not limitative. Various alternatives and equivalents are possible. The embodiments of the present invention are not limited by the type or the number of the magnetic random access memory cells used in a memory array. The embodiments of the present invention are not limited by the number of layers used to form a magnetic tunnel junction. The embodiments of the present invention are not limited by the voltage levels applied to the magnetic memory cells. Nor are the embodiments of the present invention limited by the memory circuits being used to write and re-write data found on a storage element of the same selected memory cell during write or re-write operation. The embodiments of the present invention are not limited by the type of transistor, PMOS, NMOS or otherwise, used to select a magnetic tunnel junction device. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture a magnetic random access memory. The embodiments described herein have been directed to memory reading and writing circuits but are not limited thereto. The embodiments described herein may be used wherever storing data in memory cells is subject to lengthy probabilistic writing behavior may be found useful.

What is claimed is:

1. A memory circuit comprising:
   a compare block configured to compare a first data adapted to be stored in a memory cell to a second data previously stored in the memory cell, said compare block further configured to store an address of the memory cell in which the second data is stored if the second data does not match the first data, said memory cell being written to during subsequent write cycles after the second data does not match the first data.

2. The memory circuit of claim 1 wherein said address is stored in a tag memory.

3. The memory circuit of claim 1 further comprising:
   a memory array;
   a write block coupled between the memory array and the compare block; and
   a read block coupled between the memory array and the compare block wherein the read block is adapted to sense the second data.

4. The memory circuit of claim 1 further comprising a control logic configured to store an inverse of the second data to the memory cell when the memory cell is not being accessed for a normal write operation by a device external to the memory.

5. The memory circuit of claim 1 wherein said memory cell is a DRAM, SRAM, ROM, PROM, EEPROM, FLASH, FeRAM, PRAM, MRAM or STT-MRAM cell.

6. The memory system of claim 3 wherein said memory array comprises at least one column coupled to a plurality of said memory cells wherein said column comprises a first signal line and a second signal line, and said memory cell comprises a first current carrying terminal coupled to said first signal line, a second current carrying terminal coupled to said second signal line and a control terminal coupled to a word-line.

7. The memory circuit of claim 6 wherein said memory cell further comprises:
   a magnetic tunnel junction having a first terminal coupled to said first current carrying terminal of said memory cell; and
   a first transistor having a first current carrying terminal coupled to said second current carrying terminal of said non-volatile memory cell, a gate terminal coupled to said control terminal of said non-volatile memory cell and a second current carrying terminal coupled to a second terminal of said magnetic tunnel junction.

8. A method of correcting write errors during a write operation in a memory circuit, the method comprising:
   comparing a first data adapted to be stored in a memory cell to a second data previously stored in the memory cell during a write operation;
   storing an address of the memory cell in which the second data is stored if the second data does not match the first data; and writing to said memory cell during subsequent write cycles to correct said write error.

9. The method of claim 8 further comprising:

latching the address of the memory cell;

latching the first data;

writing the first data into a memory array at the address of the memory cell; and sensing the second data during the write operation.

10. A method of correcting write errors during a write operation in a memory circuit, the method comprising:

comparing a first data adapted to be stored in a memory cell to a second data previously stored in the memory cell during a write operation;

inverting said second data if the second data does not match the first data; and writing said inverted second data to an address of the memory cell in which the second data is stored if the second data does not match the first data to correct said write error.

11. The method of claim 10 further comprising:

latching the address of the memory cell;

latching the first data;

writing the first data into a memory array at the address of the memory cell; and sensing the second data during the write operation.

12. A method of correcting write errors after a write operation in a memory circuit, the method comprising:

loading an address of a memory cell in which a second data is stored if the second data does not match a first data after a write operation;

sensing the second data;

inverting said second data; and writing said inverted second data to an address of the memory cell in which the second data is stored to correct said write error.

* * * * *